(12) United States Patent  
Shealy

(10) Patent No.: US 9,716,581 B2
(45) Date of Patent: Jul. 25, 2017

(54) MOBILE COMMUNICATION DEVICE CONFIGURED WITH A SINGLE CRYSTAL PIEZO RESONATOR STRUCTURE

(71) Applicant: Akoustis, Inc., Cornelius, NC (US)

(72) Inventor: Jeffrey B. Shealy, Cornelius, NC (US)

(73) Assignee: AKOUSTIS, INC., Huntersville, NC (US)

( * ) Notice: Subject to any disclaimer, the term of this patent is extended or adjusted under 35 U.S.C. 154(b) by 72 days.

(21) Appl. No.: 14/449,001

(22) Filed: Jul. 31, 2014

(65) Prior Publication Data

US 2016/0036580 A1 Feb. 4, 2016

(51) Int. Cl.
*H04L 12/26* (2006.01)
*H04L 5/08* (2006.01)
*H04B 1/44* (2006.01)

(52) U.S. Cl.
CPC ........ *H04L 5/08* (2013.01); *H04B 1/44* (2013.01)

(58) Field of Classification Search
CPC .............. H03H 3/02; Y01T 29/42; H04B 1/04
See application file for complete search history.

(56) References Cited

U.S. PATENT DOCUMENTS

| | | | |
|---|---|---|---|
| 5,231,327 A | 7/1993 | Ketcham | |
| 5,857,003 A * | 1/1999 | Geiger | H04L 27/2272 375/319 |
| 5,894,647 A | 4/1999 | Lakin | |
| 6,051,907 A | 4/2000 | Ylilammi | |
| 6,114,635 A | 9/2000 | Lakin et al. | |
| 6,262,637 B1 | 7/2001 | Bradley et al. | |
| 6,328,433 B1 * | 12/2001 | Moriya | B41J 2/161 310/328 |
| 6,377,137 B1 | 4/2002 | Ruby | |
| 6,384,697 B1 | 5/2002 | Ruby | |
| 6,472,954 B1 | 10/2002 | Ruby et al. | |
| 6,617,060 B2 | 9/2003 | Weeks, Jr. et al. | |
| 6,812,619 B1 | 11/2004 | Kaitila et al. | |
| 6,841,922 B2 | 1/2005 | Aigner et al. | |
| 6,864,619 B2 | 3/2005 | Aigner et al. | |
| 6,879,224 B2 | 4/2005 | Frank | |
| 6,909,340 B2 | 6/2005 | Aigner et al. | |
| 6,933,807 B2 | 8/2005 | Marksteiner et al. | |
| 7,112,860 B2 | 9/2006 | Saxler | |
| 7,250,360 B2 | 7/2007 | Shealy et al. | |
| 7,268,436 B2 | 9/2007 | Aigner et al. | |
| 7,365,619 B2 | 4/2008 | Aigner et al. | |
| 7,514,759 B1 | 4/2009 | Mehta et al. | |
| 7,875,910 B2 | 1/2011 | Sheppard et al. | |
| 7,982,363 B2 | 7/2011 | Chitnis | |
| 8,304,271 B2 | 11/2012 | Huang et al. | |
| 2001/0029650 A1 * | 10/2001 | Takata | H03H 3/10 29/25.35 |

(Continued)

*Primary Examiner* — Kevin C Harper
(74) *Attorney, Agent, or Firm* — Richard T. Ogawa; Ogawa P.C.

(57) ABSTRACT

A mobile communication system. The system has a housing comprising an interior region and an exterior region and a processing device provided within an interior region of the housing. The system has an rf transmit module coupled to the processing device, and configured on a transmit path. The system has a transmit filter provided within the rf transmit module. In an example, the transmit filter comprises a diplexer filter comprising a single crystal acoustic resonator device.

17 Claims, 8 Drawing Sheets

(56) References Cited

U.S. PATENT DOCUMENTS

| | | | |
|---|---|---|---|
| 2002/0080890 A1* | 6/2002 | Kaczynski | H03F 1/223 375/297 |
| 2002/0101305 A1* | 8/2002 | Kundu | H01P 1/20 333/202 |
| 2003/0024298 A1* | 2/2003 | Baber | G01D 3/08 73/1.82 |
| 2005/0035429 A1* | 2/2005 | Yeh | G11C 11/5692 257/529 |
| 2006/0125008 A1* | 6/2006 | Chidambarrao | H01L 21/84 257/347 |
| 2007/0103258 A1* | 5/2007 | Weinstein | H03H 3/0072 333/186 |
| 2008/0205359 A1* | 8/2008 | Rofougaran | H04B 1/406 370/338 |
| 2011/0095949 A1* | 4/2011 | Wong | H01Q 1/243 343/702 |
| 2013/0051126 A1* | 2/2013 | Kwong | H01G 4/30 365/149 |
| 2014/0187015 A1* | 7/2014 | Rui | H01L 28/56 438/381 |
| 2015/0004923 A1* | 1/2015 | Beaudin | H04B 1/04 455/127.2 |
| 2015/0033520 A1* | 2/2015 | Riaziat | H01L 41/313 29/25.35 |

* cited by examiner

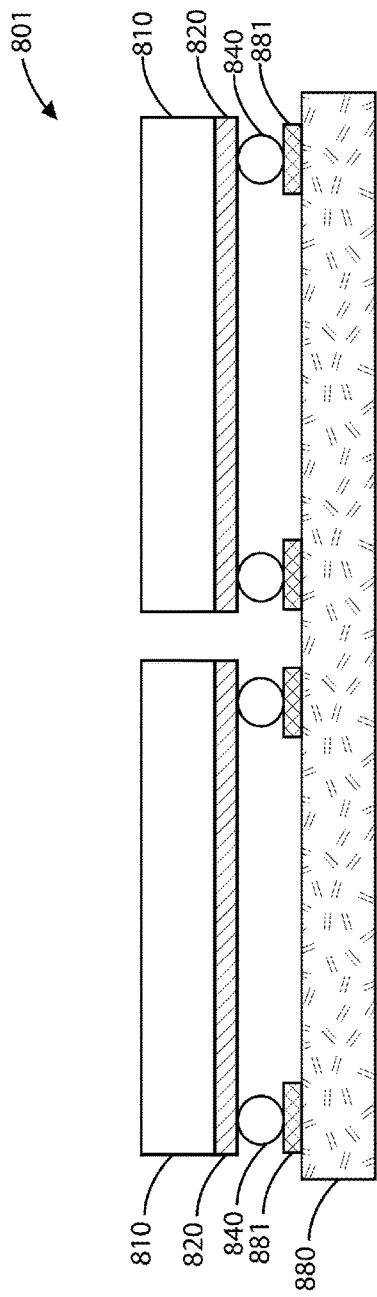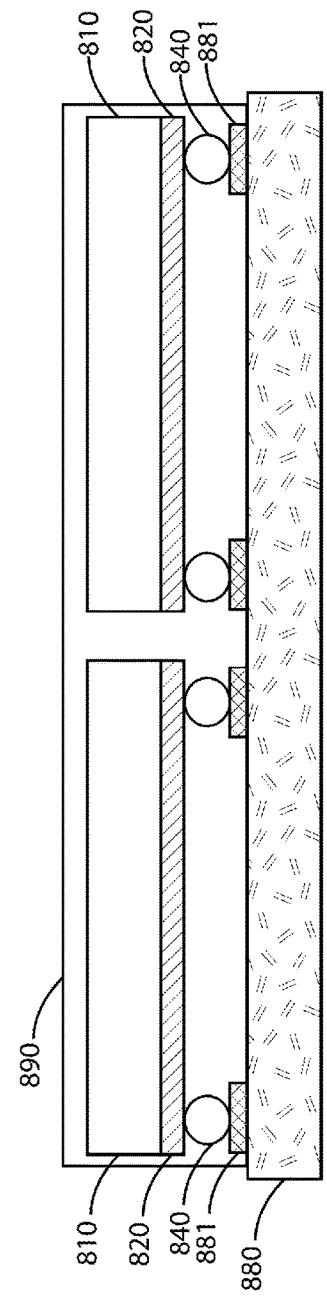

MOBILE COMMUNICATION DEVICE CONFIGURED WITH A SINGLE CRYSTAL PIEZO RESONATOR STRUCTURE

CROSS-REFERENCES TO RELATED APPLICATIONS

The present application incorporates by reference, for all purposes, the following concurrently filed patent applications, all commonly owned: U.S. patent application Ser. No. 14/298,057, titled "RESONANCE CIRCUIT WITH A SINGLE CRYSTAL CAPACITOR DIELECTRIC MATERIAL", filed Jun. 6, 2014, U.S. patent application Ser. No. 14/298,076, titled "METHOD OF MANUFACTURE FOR SINGLE CRYSTAL CAPACITOR DIELECTRIC FOR A RESONANCE CIRCUIT", filed Jun. 6, 2014, U.S. patent application Ser. No. 14/298,100, titled "INTEGRATED CIRCUIT CONFIGURED WITH TWO OR MORE SINGLE CRYSTAL ACOUSTIC RESONATOR DEVICES", filed Jun. 6, 2014, and U.S. patent applciation Ser. No. 14/341,314, titled "WAFER SCALE PACKAGING", filed Jul. 25, 2014.

BACKGROUND OF THE INVENTION

The present invention relates generally to electronic devices. More particularly, the present invention provides techniques related to a single crystal acoustic resonator. Merely by way of example, the invention has been applied to a resonator device for a communication device, mobile device, computing device, among others.

Mobile telecommunication devices have been successfully deployed world-wide. Over a billion mobile devices, including cell phones and smartphones, were manufactured in a single year and unit volume continues to increase year-over-year. With ramp of 4G/LTE in about 2012, and explosion of mobile data traffic, data rich content is driving the growth of the smartphone segment—which is expected to reach 2B per annum within the next few years. Coexistence of new and legacy standards and thirst for higher data rate requirements is driving RF complexity in smartphones. Unfortunately, limitations exist with conventional RF technology that is problematic, and may lead to drawbacks in the future.

From the above, it is seen that techniques for improving electronic devices are highly desirable.

BRIEF SUMMARY OF THE INVENTION

According to the present invention, techniques generally related to electronic devices are provided. More particularly, the present invention provides techniques related to mobile devices and system configured with a single crystal acoustic resonator. Merely by way of example, the invention has been applied to a resonator device for a communication device, mobile device, computing device, among others.

In an example, the present invention provides a mobile communication system. The system has a housing comprising an interior region and an exterior region and a processing device provided within an interior region of the housing. The system has an rf transmit module coupled to the processing device, and configured on a transmit path. The system has a transmit filter provided within the rf transmit module. In an example, the transmit filter comprises a diplexer filter comprising a single crystal acoustic resonator device.

In an example, the present invention provides a mobile communication system. The system has a housing comprising an interior region and an exterior region. In an example, the system has a display coupled the housing and a processing device provided within an interior region of the housing. In an example, the system has an rf power amplifier module coupled to the processor device. In an example, the rf power amplifier module is configured to a transmit path and a receive path. In an example, the system has an antenna coupled to the rf power amplifier module and an antenna control device configured within the rf power amplifier module. In an example, the antenna control device is also coupled to the receive path and the transmit path, and is configured to select either the receive path or the transmit path. In an example, the system has a plurality of communication bands configured within the rf power amplifier module. In an example, the plurality of communication bands are numbered from 1 through N, where N is an integer greater than 2 and less than 50. Each of the bands can be the same or different in one or more examples. The system has a single crystal acoustic resonator filter device configured with at least one of the plurality of communication bands. In an example, the system has a band-to-band isolation between any pair of adjacent communication bands such that a difference between a pass band to reject band as measured in relative decibels (dBc) is greater than 10 dBc and less than 100 dBc, although there can be variations. In an example, the system has a control device coupled to the rf power amplifier module. Optionally, the control device is configured on a CMOS platform; wherein the rf power amplifier module is made of a gallium containing material.

One or more benefits are achieved over pre-existing techniques using the invention. In particular, the invention enables a cost-effective resonator device for communications applications. In a specific embodiment, the present device can be manufactured in a relatively simple and cost effective manner. Depending upon the embodiment, the present apparatus and method can be manufactured using conventional materials and/or methods according to one of ordinary skill in the art. The present device uses a gallium and nitrogen containing material that is single crystalline. Depending upon the embodiment, one or more of these benefits may be achieved. Of course, there can be other variations, modifications, and alternatives.

A further understanding of the nature and advantages of the invention may be realized by reference to the latter portions of the specification and attached drawings.

BRIEF DESCRIPTION OF THE DRAWINGS

In order to more fully understand the present invention, reference is made to the accompanying drawings. Understanding that these drawings are not to be considered limitations in the scope of the invention, the presently described embodiments and the presently understood best mode of the invention are described with additional detail through use of the accompanying drawings in which:

FIGS. 8A and 8B are simplified diagrams of a packaging configuration for a diplexer device according to an example of the present invention.

DETAILED DESCRIPTION OF THE INVENTION

According to the present invention, techniques generally related to electronic devices are provided. More particularly, the present invention provides techniques related to a single crystal acoustic resonator. Merely by way of example, the invention has been applied to a resonator device for a communication device, mobile device, computing device, among others.

As additional background, the number of bands supported by smartphones is estimated to grow by 7-fold compared to conventional techniques. As a result, more bands mean high selectivity filter performance is becoming a differentiator in the RF front end of smartphones. Unfortunately, conventional techniques have severe limitations.

That is, conventional filter technology is based upon amorphous materials and whose electromechanical coupling efficiency is poor (only 7.5% for non-lead containing materials) leading to nearly half the transmit power dissipated in high selectivity filters. In addition, single crystal acoustic wave devices are expected to deliver improvements in adjacent channel rejection. Since there are twenty (20) or more filters in present smartphone and the filters are inserted between the power amplifier and the antenna solution, then there is an opportunity to improve the RF front end by reducing thermal dissipation, size of power amplifier while enhancing the signal quality of the smartphone receiver and maximize the spectral efficiency within the system.

Utilizing single crystal acoustic wave device (herein after "SAW" device) and filter solutions, one or more of the following benefits may be achieved: (1) large diameter silicon wafers (up to 200 mm) are expected to realize cost-effective high performance solutions, (2) electromechanical coupling efficiency is expected to more than triple with newly engineered strained piezo electric materials, (3) Filter insertion loss is expected to reduce by 1 dB enabling longer battery life, improve thermal management with smaller RF footprint and improving the signal quality and user experience. These and other benefits can be realized by the present device and method as further provided throughout the present specification, and more particularly below.

Figure 1:
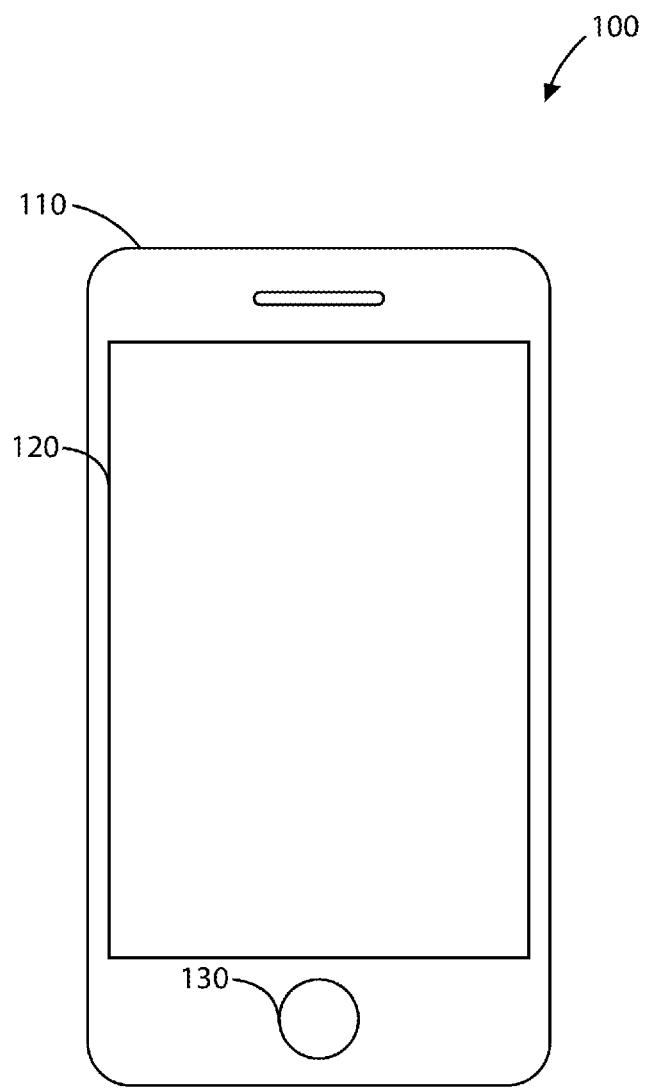
FIG. 1 is a simplified illustrating a smart phone according to an example of the present invention.

FIG. 1 is a simplified diagram 100 illustrating a smart phone with a capture image of a user according to an embodiment of the present invention. As shown, the smart phone includes a housing 110, display 120, and interface device 130, which may include a button, microphone, or touch screen. Preferably, the phone has a high-resolution camera device, which can be used in various modes. An example of a smart phone can be an iPhone from Apple Computer of Cupertino Calif. Alternatively, the smart phone can be a Galaxy from Samsung or others.

In an example, the smart phone includes the following features (which are found in an iPhone 4 from Apple Computer, although there can be variations), see www.apple.com.

GSM model: UMTS/HSDPA/HSUPA (850, 900, 1900, 2100 MHz); GSM/EDGE (850, 900, 1800, 1900 MHz)

CDMA model: CDMA EV-DO Rev. A (800, 1900 MHz)

802.11b/g/n Wi-Fi (802.11n 2.4 GHz only)

Bluetooth 2.1+EDR wireless technology

Assisted GPS

Digital compass

Wi-Fi

Cellular

Retina display 3.5-inch (diagonal) widescreen Multi-Touch display

800:1 contrast ratio (typical)

500 cd/m2 max brightness (typical)

Fingerprint-resistant oleophobic coating on front and back

Support for display of multiple languages and characters simultaneously 5-megapixel iSight camera Video recording, HD (720p) up to 30 frames per second with audio VGA-quality photos and video at up to 30 frames per second with the front camera Tap to focus video or still images LED flash Photo and video geotagging Built-in rechargeable lithium-ion battery Charging via USB to computer system or power adapter Talk time: Up to 7 hours on 3G, up to 14 hours on 2G (GSM)

Standby time: Up to 300 hours

Internet use: Up to 6 hours on 3G, up to 10 hours on Wi-Fi

Video playback: Up to 10 hours

Audio playback: Up to 40 hours

Frequency response: 20 Hz to 20,000 Hz

Audio formats supported: AAC (8 to 320 Kbps), Protected AAC (from iTunes Store), HE-AAC, MP3 (8 to 320 Kbps), MP3 VBR, Audible (formats 2, 3, 4, Audible Enhanced Audio, AAX, and AAX+), Apple Lossless, AIFF, and WAV User-configurable maximum volume limit Video out support at up to 720p with Apple Digital AV Adapter or Apple VGA Adapter; 576p and 480p with Apple Component AV Cable; 576i and 48i with Apple Composite AV Cable (cables sold separately)

Video formats supported: H.264 video up to 720p, 30 frames per second, Main Profile Level 3.1 with AAC-LC audio up to 160 Kbps, 48 kHz, stereo audio in .m4v, .mp4, and .mov file formats; MPEG-4 video up to 2.5 Mbps, 640 by 480 pixels, 30 frames per second, Simple Profile with AAC-LC audio up to 160 Kbps per channel, 48 kHz, stereo audio in .m4v, .mp4, and .mov file formats; Motion JPEG (M-JPEG) up to 35 Mbps, 1280 by 720 pixels, 30 frames per second, audio in ulaw, PCM stereo audio in .avi file format Three-axis gyro Accelerometer Proximity sensor Ambient light sensor."

An exemplary electronic device may be a portable electronic device, such as a media player, a cellular phone, a personal data organizer, or the like. Indeed, in such embodiments, a portable electronic device may include a combination of the functionalities of such devices. In addition, the electronic device may allow a user to connect to and communicate through the Internet or through other networks, such as local or wide area networks. For example, the portable electronic device may allow a user to access the internet and to communicate using e-mail, text messaging, instant messaging, or using other forms of electronic communication. By way of example, the electronic device may be a model of an iPod having a display screen or an iPhone available from Apple Inc.

In certain embodiments, the device may be powered by one or more rechargeable and/or replaceable batteries. Such embodiments may be highly portable, allowing a user to carry the electronic device while traveling, working, exercising, and so forth. In this manner, and depending on the functionalities provided by the electronic device, a user may listen to music, play games or video, record video or take pictures, place and receive telephone calls, communicate with others, control other devices (e.g., via remote control and/or Bluetooth functionality), and so forth while moving freely with the device. In addition, device may be sized such that it fits relatively easily into a pocket or a hand of the user. While certain embodiments of the present invention are described with respect to a portable electronic device, it should be noted that the presently disclosed techniques may be applicable to a wide array of other, less portable, electronic devices and systems that are configured to render graphical data, such as a desktop computer.

In the presently illustrated embodiment, the exemplary device includes an enclosure or housing 110, a display, user input structures, and input/output connectors. The enclosure may be formed from plastic, metal, composite materials, or other suitable materials, or any combination thereof. The enclosure may protect the interior components of the electronic device from physical damage, and may also shield the interior components from electromagnetic interference (EMI).

The display 120 may be a liquid crystal display (LCD), a light emitting diode (LED) based display, an organic light emitting diode (OLED) based display, or some other suitable display. In accordance with certain embodiments of the present invention, the display may display a user interface and various other images, such as logos, avatars, photos, album art, and the like. Additionally, in one embodiment, the display may include a touch screen through which a user may interact with the user interface. The display may also include various function and/or system indicators to provide feedback to a user, such as power status, call status, memory status, or the like. These indicators may be incorporated into the user interface displayed on the display.

In one embodiment, one or more of the user input structures 130 are configured to control the device, such as by controlling a mode of operation, an output level, an output type, among others. For instance, the user input structures may include a button to turn the device on or off. Further the user input structures may allow a user to interact with the user interface on the display. Embodiments of the portable electronic device may include any number of user input structures, including buttons, switches, a control pad, a scroll wheel, or any other suitable input structures. The user input structures may work with the user interface displayed on the device to control functions of the device and/or any interfaces or devices connected to or used by the device. For example, the user input structures may allow a user to navigate a displayed user interface or to return such a displayed user interface to a default or home screen.

The exemplary device may also include various input and output ports to allow connection of additional devices. For example, a port may be a headphone jack that provides for the connection of headphones. Additionally, a port may have both input/output capabilities to provide for connection of a headset (e.g., a headphone and microphone combination).

Embodiments of the present invention may include any number of input and/or output ports, such as headphone and headset jacks, universal serial bus (USB) ports, IEEE-1394 ports, and AC and/or DC power connectors. Further, the device may use the input and output ports to connect to and send or receive data with any other device, such as other portable electronic devices, personal computers, printers, or the like. For example, in one embodiment, the device may connect to a personal computer via an IEEE-1394 connection to send and receive data files, such as media files. Further details of the device can be found in U.S. Pat. No. 8,294,730, assigned to Apple, Inc.

Figure 2:
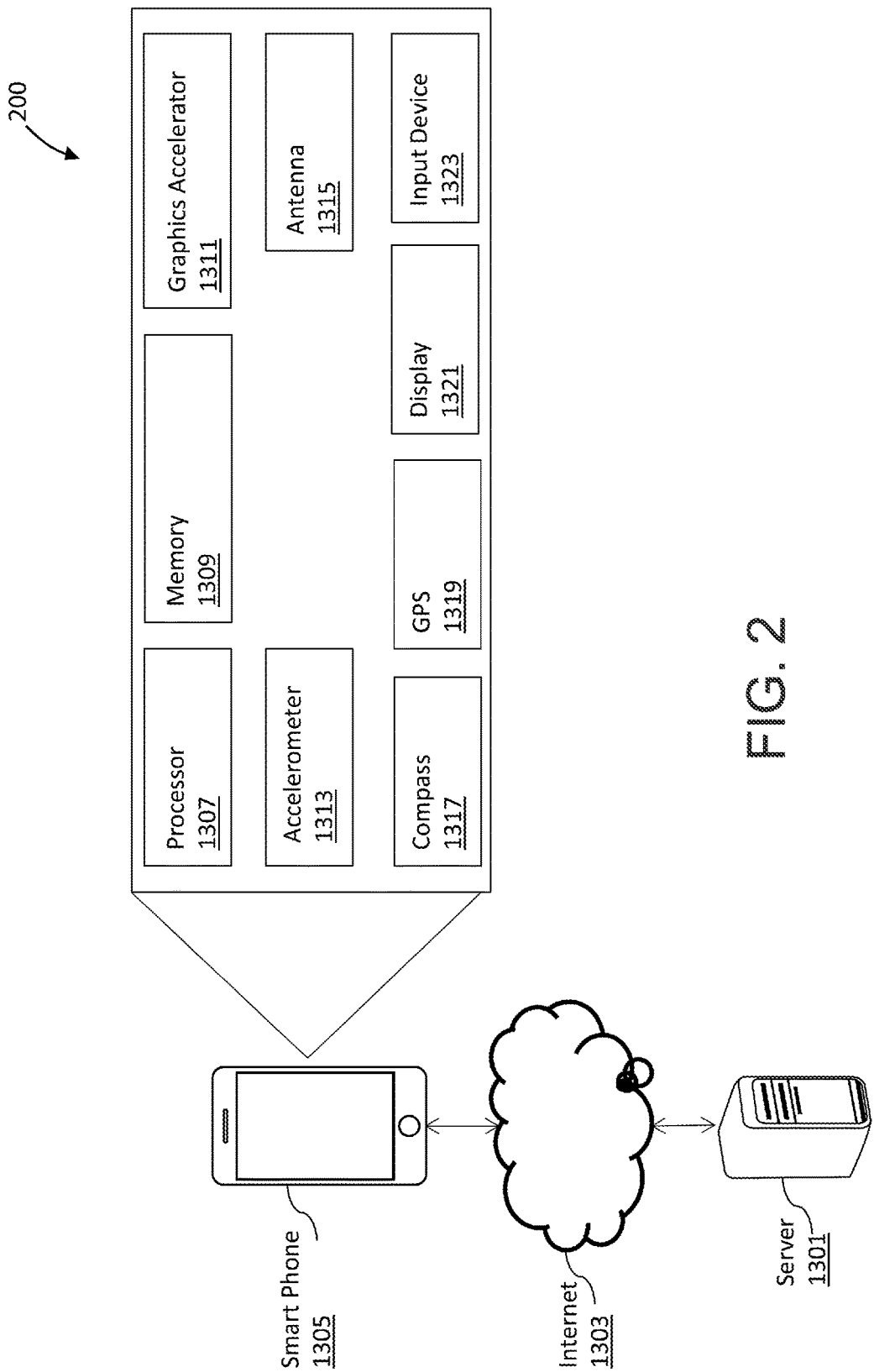
FIG. 2 is a simplified system diagram with a smart phone according to an example of the present invention.

FIG. 2 is a simplified system diagram 200 with a smart phone according to an embodiment of the present invention. A server 1301 is in electronic communication with a handheld electronic device 1305 having functional components such as a processor 1307, memory 1309, graphics accelerator 1311, accelerometer 1313, communications interface 1315, compass 1317, GPS 1319, display 1321, and input device 1323. Each device is not limited to the illustrated components. The components may be hardware, software or a combination of both.

In some examples, instructions are input to the handheld electronic device 1305 through an input device 1323 that instructs the processor 1307 to execute functions in an electronic imaging application. One potential instruction can be to generate a wireframe of a captured image of a portion of a human user. In that case the processor 1307 instructs the communications interface 1315 to communicate with the server 1301, via the internet 1303 or the like, and transfer human wireframe or image data. The data transferred by the communications interface 1315 and either processed by the processor 1307 immediately after image capture or stored in memory 1309 for later use, or both. The processor 1307 also receives information regarding the display's 1321 attributes, and can calculate the orientation of the device, or e.g., using information from an accelerometer 1313 and/or other external data such as compass headings from a compass 1317, or GPS location from a GPS chip, and the processor then uses the information to determine an orientation in which to display the image depending upon the example.

In an example, the captured image can be drawn by the processor 1307, by a graphics accelerator 1311, or by a combination of the two. In some embodiments, the processor 1307 can be the graphics accelerator. The image can be first drawn in memory 1309 or, if available, memory directly associated with the graphics accelerator 1311. The methods described herein can be implemented by the processor 1307, the graphics accelerator 1311, or a combination of the two to create the image and related wireframe. Once the image or wireframe is drawn in memory, it can be displayed on the display 1321.

Figure 3:
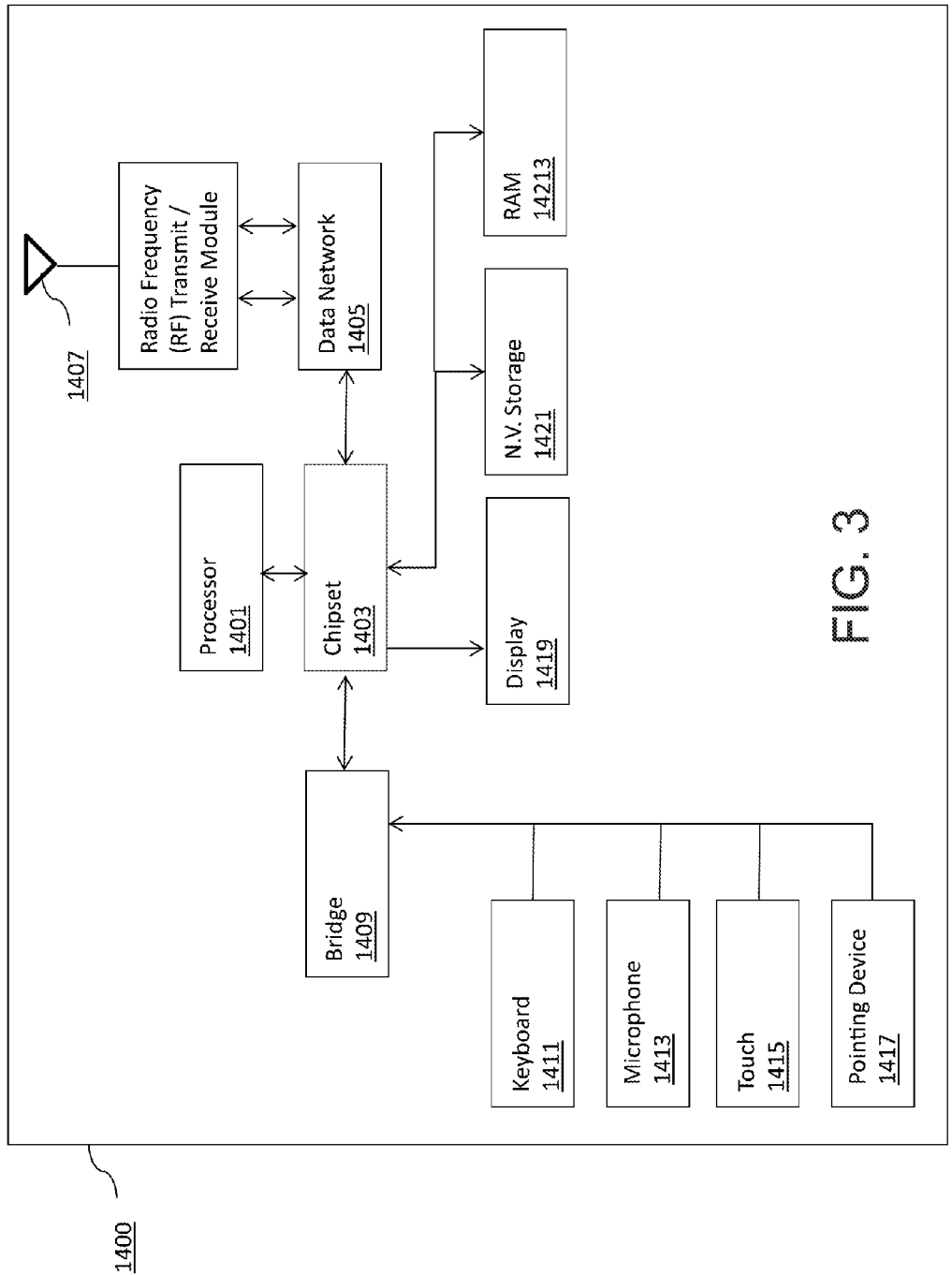
FIG. 3 is a simplified diagram of a smart phone system diagram according to an example of the present invention.

FIG. 3 is a simplified diagram of a smart phone system diagram according to an example of the present invention. System 1400 is an example of hardware, software, and firmware that can be used to implement disclosures above. System 1400 includes a processor 1401, which is representative of any number of physically and/or logically distinct resources capable of executing software, firmware, and hardware configured to perform identified computations. Processor 1401 communicates with a chipset 1403 that can control input to and output from processor 1401. In this example, chipset 1403 outputs information to display 1419 and can read and write information to non-volatile storage 1421, which can include magnetic media and solid state media, for example. Chipset 1403 also can read data from and write data to RAM 14213. A bridge 1409 for interfacing with a variety of user interface components can be provided for interfacing with chipset 1403. Such user interface components can include a keyboard 1411, a microphone 1413, touch-detection-and-processing circuitry 1415, a pointing device such as a mouse 1417, and so on. In general, inputs to system 1400 can come from any of a variety of sources, machine-generated and/or human-generated sources.

Chipset 1403 also can interface with one or more data network interfaces 1405 that can have different physical interfaces 1407. Such data network interfaces can include interfaces for wired and wireless local area networks, for broadband wireless networks, as well as personal area networks. Some applications of the methods for generating and displaying and using the GUI disclosed herein can include receiving data over physical interface 1407 or be generated by the machine itself by processor 1401 analyzing data stored in memory 1421 or 14213. Further, the machine can receive inputs from a user via devices keyboard 1411, microphone 1413, touch device 1414, and pointing device 1417 and execute appropriate functions, such as browsing functions by interpreting these inputs using processor 1401.

A transmit module and a receive module is coupled between the antenna and data network interfaces. In an example, the transmit module and the receive module can be separate devices, or integrated with each other in a single module. Of course, there can be alternatives, modifications, and variations. Further details of the module can be found throughout the present specification and more particularly below.

Figure 4:
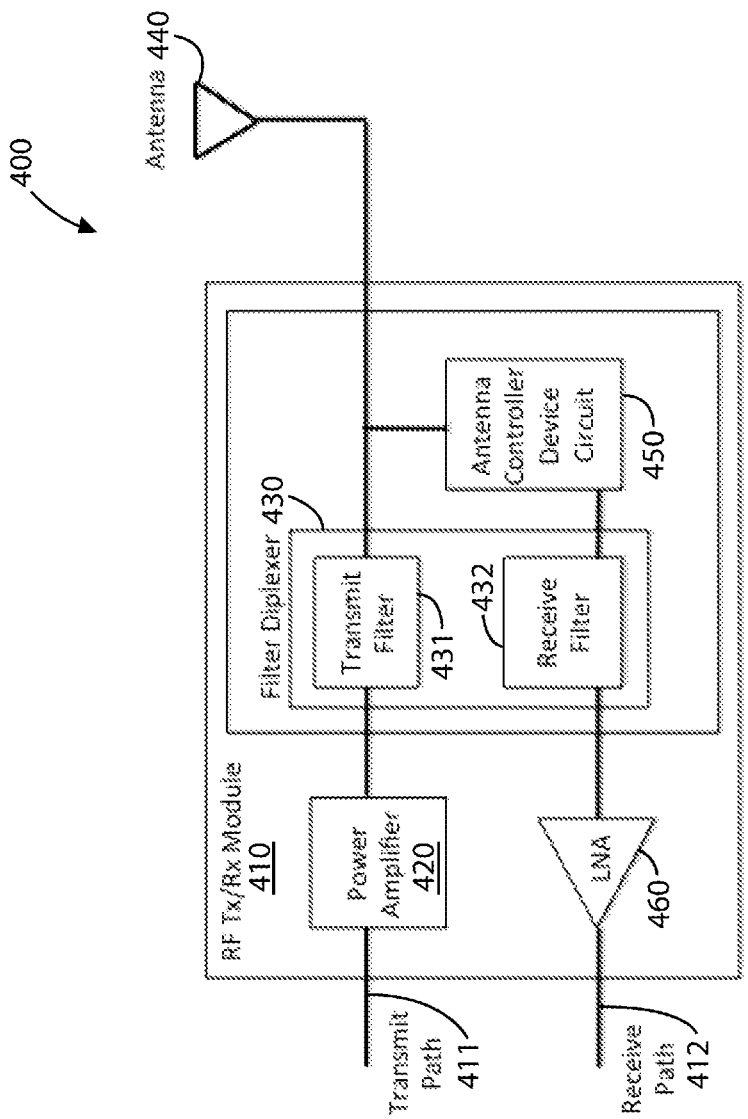
FIG. 4 is a simplified diagram of a transmit module and a receive module according to examples of the present invention.

FIG. 4 is a simplified diagram of a transmit module and a receive module 410 according to examples of the present invention. In an example, the transmit module and the receive module are shown as one block structure. As shown, the rf transmit module is configured on a transmit path 411. The rf receive module is configured on a receive path 412.

In an example, the antenna 440 is coupled to the rf transmit module 431 and the rf receive module 432. As shown, an antenna control device 450 is coupled to the receive path 412 and the transmit path 411, and is configured to select either the receive path 412 or the transmit path 411.

In other examples, the antenna control can include a variety of features. Such features include signal tracking, filtering, and the like.

In an example, a receive filter 432 provided within the rf receive module. In an example, a low noise amplifier device 460 coupled to the rf receive module. The low noise amplifier can be of CMOS, GaAs, SiGe process technology, or the like.

In an example, a transmit filter 431 is provided within the rf transmit module. In an example, the transmit filter comprises a diplexer filter 430 comprising a single crystal acoustic resonator device. As shown in FIG. 4, the filter diplexer 430 includes both the transmit and receive filters 431, 432.

In an example, a power amplifier 420 is coupled to the rf transmit module, and configured to drive a signal through the transmit path 411 to the antenna 440. In an example, the power amplifier is CMOS, GaAs, SiGe process technology, or the like.

In an example, a band-to-band isolation is characterizing the transmit filter such that a difference between a pass band to reject band as measured in relative decibels (dBc) is greater than 10 dBc and less than 100 dBc. In other examples, the difference can have a broader or narrower range.

In an example, an insertion loss characterizing the transmit filter, the insertion loss being less than 3 dB and greater than 0.5 dB.

In other examples, a center frequency configured to define the pass band.

In an example, the single crystal acoustic resonator device is included. In an example, the device a substrate, which has a surface region. In an example, the resonator device has a first electrode material coupled to a portion of the substrate, and a single crystal capacitor dielectric material having a thickness of greater than 0.4 microns and overlying an exposed portion of the surface region and coupled to the first electrode material. In an example, the single crystal capacitor dielectric material is characterized by a dislocation density of less than $10^{12}$ defects/cm$^2$. In an example, the device has a second electrode material overlying the single crystal capacitor dielectric material.

Figure 5:
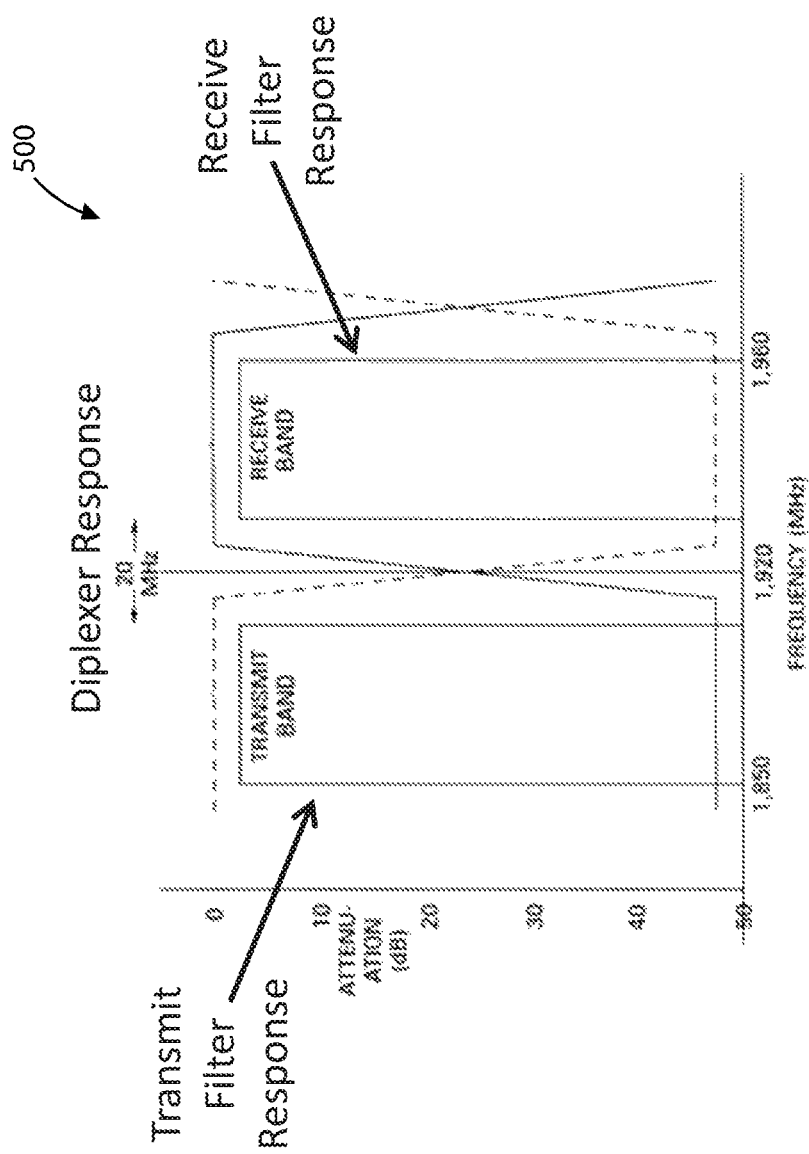
FIG. 5 is an example of filter response in an example of the present invention.

FIG. 5 is an example of filter response in an example of the present invention. As shown, the diplexer response graph shows attenuation plotted against frequency. Attenuation is measured in decibels (dB), and frequency in hertz. The first region represents the transmit filter response, while the second region represents the receive filter response.

Figure 6:
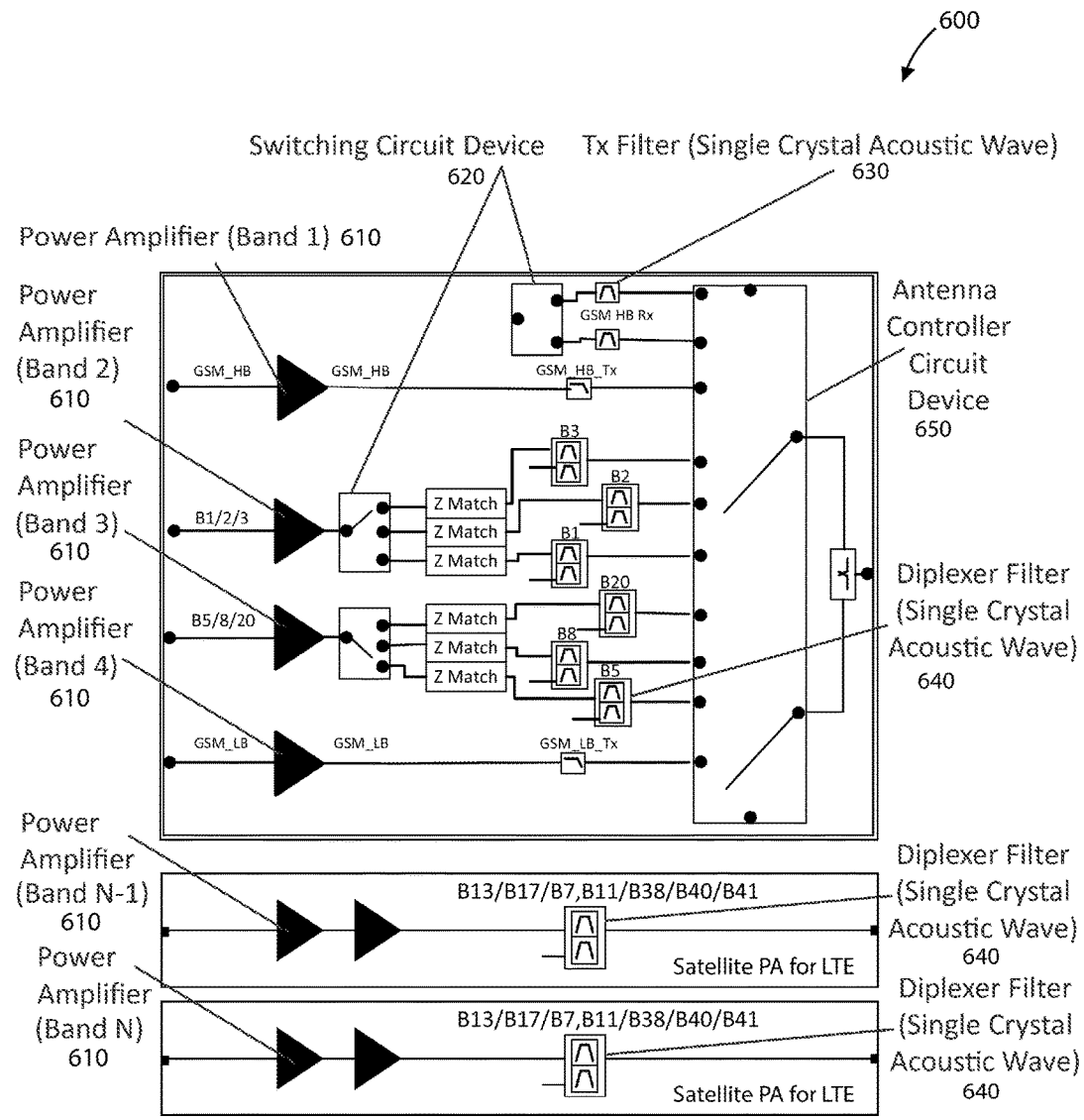
FIG. 6 is a simplified diagram of a smart phone rf power amplifier module according to an example of the present invention.

FIG. 6 is a simplified diagram of a smart phone rf power amplifier module 600 according to an example of the present invention. In an example as shown is an rf power amplifier module 610 coupled to a processor device, as described previously in FIGS. 2 and 3. In an example, the rf power amplifier module 610 is configured to a transmit path and a receive path. Also, any of the power amplifier modules can contain one or more single crystal acoustic wave filters.

In an example, the module has an antenna coupled to the rf power amplifier module 610. In an example, the module has an antenna control device 650 configured within the rf power amplifier module 610. In an example, the control device 650 is coupled to the receive path and the transmit path, and is configured to select either the receive path or the transmit path.

As shown, the module has a plurality of communication bands 610 configured within the rf power amplifier module. In an example, the plurality of communication bands are numbered from 1 through N, where N is an integer greater than 2 and less than 50, although there can be variations. In an example, each of the communication bands can include a power amplifier. In an example, the power amplifier is CMOS, GaAs, SiGe process technology, or the like.

In an example, one or more of the communication bands can be configured with a diplexer filter device. The diplexer filter device 640 is configured from a single crystal acoustic resonator device. An example of such device can be found in U.S. Ser. No. 14/298,057, commonly assigned, and hereby incorporated by reference herein.

In an example, the module has a single crystal acoustic resonator filter device configured with at least one of the plurality of communication bands, as shown.

In an example, one or more of the communication bands can be configured with a switching device 620. The switching device 620 is coupled to an output impedance matching circuit, as shown. The matching circuit is configured to multiple acoustic wave filters as shown. The paths are controlled by the switching device.

In an example, the module has a band-to-band isolation between any pair of adjacent communication bands such that a difference between a pass band to reject band as measured in relative decibels (dBc) is greater than 10 dBc and less than 100 dBc.

In an example, the module has a control device coupled to the rf power amplifier module.

Figure 7A:
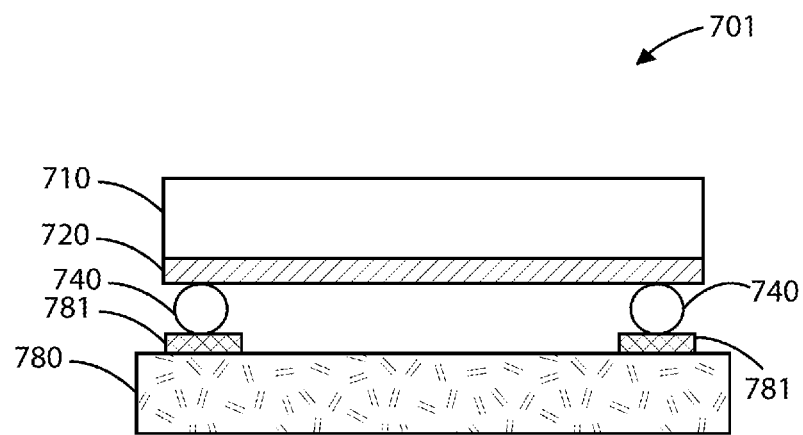
FIGS. 7A and 7B are simplified diagrams of a packaging configuration for the power amplifier module according to an example of the present invention.
Figure 7B:
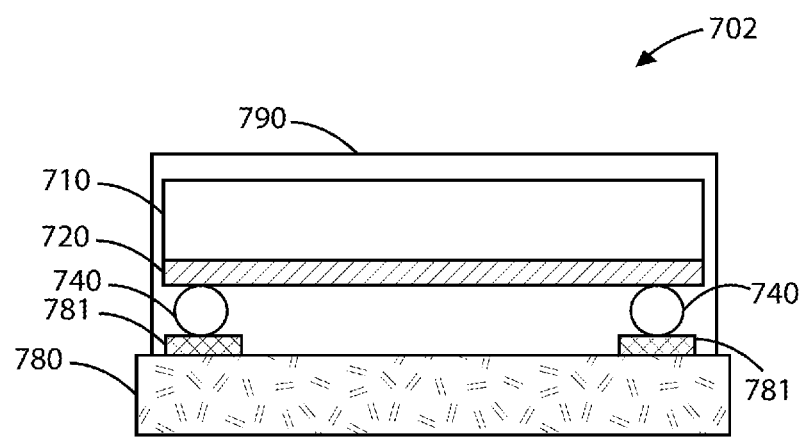

FIGS. 7A and 7B are simplified diagrams of a packaging configuration for the power amplifier module according to an example of the present invention. As shown, the power amplifier module can be configured on a board. The acoustic resonator device can be packaged on the board, and even molded using a resin coating configured to the board to protect the resonator device, as shown. In an example, the device 701 can include a resonator device including a piezo layer 720 overlying a substrate 710, which is flipped and coupled to a laminate board 5780 through copper bumps 740 connected to metal interconnects 781. FIG. 7B shows a similar device 702, but the device is packaged in an encapsulation 790.

FIG. 8 is a simplified diagram of a packaging configuration for a diplexer device according to an example of the present invention. As shown are a pair of acoustic resonator device configured on a single board, using flip chip mounting techniques. Such techniques use solder bumps configured on copper pillar structures. In an example, the device 801 can include two resonator devices each including a piezo layer 820 overlying a substrate 810, which is flipped and coupled to a laminate board 880 through copper bumps 840 connected to metal interconnects 881. FIG. 8B shows a similar device 802, but the device is packaged in an encapsulation 890. In an example, the power amplifier module described previously can be a mix of a single crystal filter and a non-single crystal acoustic wave filter. Further details of these packaging configurations can be found in U.S. Ser. No. 14/341,314, commonly assigned, and hereby incorporated by reference herein.

As used herein, the terms "first" "second" "third" and "nth" shall be interpreted under ordinary meaning Such terms, alone or together, do not necessarily imply order, unless understood that way by one of ordinary skill in the art. Additionally, the terms "top" and "bottom" may not have a meaning in reference to a direction of gravity, while should be interpreted under ordinary meaning These terms shall not unduly limit the scope of the claims herein.

As used herein, the term substrate is associated with Group III-nitride based materials including GaN, InGaN, AlGaN, or other Group III containing alloys or compositions that are used as starting materials, or AN or the like. Such starting materials include polar GaN substrates (i.e., substrate where the largest area surface is nominally an (h k l) plane wherein h=k=0, and l is non-zero), non-polar GaN substrates (i.e., substrate material where the largest area surface is oriented at an angle ranging from about 80-100 degrees from the polar orientation described above towards an (h k l) plane wherein l=0, and at least one of h and k is non-zero) or semi-polar GaN substrates (i.e., substrate material where the largest area surface is oriented at an angle ranging from about +0.1 to 80 degrees or 110-179.9 degrees from the polar orientation described above towards an (h k l) plane wherein l=0, and at least one of h and k is non-zero.).

As shown, the present device can be enclosed in a suitable package.

In an example, the present invention provides a mobile communication system. The system has a housing comprising an interior region and an exterior region. In an example, the system has a display coupled the housing and a processing device provided within an interior region of the housing. In an example, the system has an rf transmit module coupled to the processing device, and configured on a transmit path. In an example, the system has an rf receive module coupled to the processing device, and configured on a receive path.

In an example, the system has an antenna coupled to the rf transmit module and the rf receive module and an antenna control device coupled to the receive path and the transmit path, and is configured to select either the receive path or the transmit path. In an example, the system has a receive filter provided within the rf receive module and a low noise amplifier device coupled to the rf receive module. In an example, the system has a transmit filter provided within the rf transmit module. In an example, the transmit filter comprises a diplexer filter comprising a single crystal acoustic resonator device.

In an example, the system has a power amplifier coupled to the rf transmit module, and is configured to drive a signal through the transmit path to the antenna. In an example, the system has a band-to-band isolation charactering the transmit filter such that a difference between a pass band to reject band as measured in relative decibels (dBc) is greater than 10 dBc and less than 100 dBc. In an example, the system has an insertion loss characterizing the transmit filter. In an example, the insertion loss is less than 3 dB and greater than 0.5 dB and a center frequency configured to define the pass band.

In an example, the single crystal acoustic resonator device comprises a substrate, the substrate having a surface region, a first electrode material coupled to a portion of the substrate, a single crystal capacitor dielectric material having a thickness of greater than 0.4 microns and overlying an exposed portion of the surface region and coupled to the first electrode material. In an example, the single crystal capacitor dielectric material is characterized by a dislocation density of less than $10^{12}$ defects/cm2. In an example, the device has a second electrode material overlying the single crystal capacitor dielectric material.

In an example, the single crystal capacitor material is selected from at least one of GaN, AN, AlGaN, InN, BN, or other group III nitrides or at least one of a single crystal oxide including a high K dielectric, ZnO, or MgO.

In an example, the single crystal capacitor dielectric material is characterized by a surface region of at least 50 micron by 50 micron, although there can be variations. In an example, the single crystal capacitor dielectric material is configured in a first strain state to compensate to the substrate. In an example, the single crystal capacitor dielectric material is deposited overlying the exposed portion of the substrate.

In an example, the system comprises a reflector region configured to the first electrode material. In an example, the first electrode material and the single crystal capacitor dielectric material comprises a first interface region substantially free from an oxide bearing material.

In an example, the system has a nucleation material provided between the single crystal capacitor dielectric material and the first electrode material; and further comprising a capping material provided between the single crystal capacitor dielectric material and the second electrode material. In an example, the single crystal capacitor dielectric material is characterized by a FWHM of less than one degree; and further comprising a parameter derived from a two port analysis.

In an example, the first electrode material comprises a first electrode structure configured and routed to a vicinity of a plane parallel to a contact region coupled to the second electrode material. In an example, the surface region of the substrate is bare and exposed crystalline material. In an example, the single crystal capacitor dielectric is configured to propagate a longitudinal signal at an acoustic velocity of 6000 meters/second and greater; and further comprising a first contact coupled to the first electrode material and a second contact coupled to the second electrode material such that each of the first contact and the second contact are configured in a co-planar arrangement; and wherein the semiconductor substrate is selected from a silicon, a gallium arsenide, gallium nitride, aluminum nitride, an aluminum oxide, or others.

While the above is a full description of the specific embodiments, various modifications, alternative constructions and equivalents may be used. As an example, the packaged device can include any combination of elements described above, as well as outside of the present specification. As used herein, the term "substrate" can mean the bulk substrate or can include overlying growth structures such as a gallium and nitrogen containing epitaxial region, or functional regions, combinations, and the like. Therefore, the above description and illustrations should not be taken as limiting the scope of the present invention which is defined by the appended claims.

What is claimed is:

1. A mobile communication system comprising:
   a housing comprising an interior region and an exterior region;
   a display coupled to the housing;
   a processing device provided within the interior region of the housing;
   a filter diplexer module comprising
      an rf transmit module coupled to the processing device and configured on a transmit path, wherein the rf transmit module includes a transmit filter having one or more diplexer filter devices, each of the one or more diplexer filter devices comprising a single crystal acoustic resonator device;
      an rf receive module coupled to the processing device and configured on a receive path, wherein the rf receive module includes a receive filter;
   an antenna coupled to the rf transmit module and the rf receive module;
   an antenna control device coupled to the receive path and the transmit path and configured to select either the receive path or the transmit path, wherein the antenna control device is coupled to the filter diplexer module;
   a power amplifier module coupled to the processing device and the filter diplexer module, the power amplifier module being configured on the transmit path and the receive path, wherein the power amplifier module comprises a plurality of communication bands, each communication band having a power amplifier, wherein the one or more diplexer filter devices are configured to one or more of the plurality of communication bands;
   a band-to-band isolation between any pair of adjacent communication bands in the plurality of communication bands characterizing the transmit filter such that a difference between a pass band to reject band as measured in relative decibels (dBc) is greater than 10 dBc and less than 100 dBc;
   an insertion loss characterizing the transmit filter, the insertion loss being less than 3 dB and greater than 0.5 dB; and
   a center frequency configured to define the pass band;
   wherein each single crystal acoustic resonator devices of the diplexer filter devices comprises:
      a substrate having a surface region;
      a first electrode material coupled to a portion of the substrate;
      a reflector region configured to the first electrode material;
      a single crystal capacitor dielectric material having a thickness of greater than 0.4 microns and overlying an exposed portion of the surface region and coupled to the first electrode material, the single crystal capacitor dielectric material being characterized by a dislocation density of less than $10^{12}$ defects/cm$^2$; and
      a second electrode material overlying the single crystal capacitor dielectric material.

2. The system of claim 1 wherein the single crystal capacitor material is selected from at least one of GaN, AlN, AlGaN, InN, BN, or other group III nitrides or at least one of a single crystal oxide including a high K dielectric, ZnO, or MgO.

3. The system of claim 1 wherein the single crystal capacitor dielectric material is characterized by a surface region of at least 200 microns by 200 microns; and wherein the single crystal capacitor dielectric material is configured in a first strain state to compensate to the substrate; wherein the single crystal capacitor dielectric material is deposited overlying the exposed portion of the substrate.

4. The system of claim 1 wherein the first electrode material and the single crystal capacitor dielectric material comprises a first interface region substantially free from an oxide bearing material.

5. The system of claim 1 further comprising a nucleation material provided between the single crystal capacitor dielectric material and the first electrode material; and further comprising a capping material provided between the single crystal capacitor dielectric material and the second electrode material.

6. The system of claim 1 wherein the single crystal capacitor dielectric material is characterized by a FWHM of less than one degree; and further comprising a parameter derived from a two port analysis.

7. The system of claim 1 wherein the first electrode material comprises a first electrode structure configured and routed to a vicinity of a plane parallel to a contact region coupled to the second electrode material.

8. The system of claim 1 wherein the surface region of the substrate is bare and exposed crystalline material; and wherein the single crystal capacitor dielectric material is configured to propagate a longitudinal signal at an acoustic velocity of 6000 meters/second and greater; and further comprising a first contact coupled to the first electrode material and a second contact coupled to the second electrode material such that each of the first contact and the second contact are configured in a co-planar arrangement.

9. The system of claim 1 wherein the semiconductor substrate is selected from a silicon, a gallium arsenide, gallium nitride, aluminum nitride, an aluminum oxide, or others.

10. A mobile communication system comprising:
    a housing comprising an interior region and an exterior region;
    a display coupled to the housing;
    a processing device provided within the interior region of the housing;
    an rf transmit module coupled to the processing device, and configured on a transmit path;
    an rf receive module coupled to the processing device, and configured on a receive path;
    an antenna coupled to the rf transmit module and the rf receive module;

an antenna control device coupled to the receive path and the transmit path, and configured to select either the receive path or the transmit path;
a receive filter provided within the rf receive module;
a low noise amplifier device coupled to the rf receive module;
a transmit filter provided within the rf transmit module, the transmit filter having a diplexer filter comprising a single crystal acoustic resonator device; and
a power amplifier module coupled to the rf transmit module, and configured to drive a signal through the transmit path to the antenna;
wherein the power amplifier module includes a plurality of communication bands numbered from 1 to N, where N is an integer greater than 2 and less than 50, wherein each of the communication bands includes a power amplifier, wherein one or more of the communication bands is coupled to the diplexer filter;
a switching device coupled to one or more of the plurality of communication bands and to an output impedance matching circuit, wherein the output impedance matching circuit is coupled to the diplexer filter;
a band-to-band isolation characterizing the transmit filter such that a difference between a pass band to reject band as measured in relative decibels (dBc) is greater than 10 dBc and less than 100 dBc;
an insertion loss characterizing the transmit filter, the insertion loss being less than 3 dB and greater than 0.5 dB; and
a center frequency configured to define the pass band; and
wherein the single crystal acoustic resonator device comprises:
    a substrate having a surface region;
    a first electrode material coupled to a portion of the substrate;
    a single crystal capacitor dielectric material having a thickness of greater than 0.4 microns and overlying an exposed portion of the surface region and coupled to the first electrode material, the single crystal capacitor dielectric material being characterized by a dislocation density of less than $10^{12}$ defects/cm$^2$; and
    a second electrode material overlying the single crystal capacitor dielectric material;
wherein the single crystal capacitor dielectric material is characterized by a surface region of at least 200 microns by 200 microns; and wherein the single crystal capacitor dielectric material is configured in a first strain state to compensate to the substrate; wherein the single crystal capacitor dielectric material is deposited overlying the exposed portion of the substrate.

11. The system of claim 10 wherein the single crystal capacitor material is selected from at least one of GaN, AlN, AlGaN, InN, BN, or other group III nitrides or at least one of a single crystal oxide including a high K dielectric, ZnO, or MgO.

12. The system of claim 10 further comprising a reflector region configured to the first electrode material.

13. The system of claim 10 wherein the first electrode material and the single crystal capacitor dielectric material comprise a first interface region substantially free from an oxide bearing material.

14. The system of claim 10 further comprising a nucleation material provided between the single crystal capacitor dielectric material and the first electrode material; and further comprising a capping material provided between the single crystal capacitor dielectric material and the second electrode material.

15. The system of claim 10 wherein the single crystal capacitor dielectric material is characterized by a FWHM of less than one degree; and further comprising a parameter derived from a two port analysis.

16. The system of claim 10 wherein the first electrode material comprises a first electrode structure configured and routed to a vicinity of a plane parallel to a contact region coupled to the second electrode material.

17. The system of claim 10 wherein the surface region of the substrate is bare and exposed crystalline material; and wherein the single crystal capacitor dielectric is configured to propagate a longitudinal signal at an acoustic velocity of 6000 meters/second and greater; and further comprising a first contact coupled to the first electrode material and a second contact coupled to the second electrode material such that each of the first contact and the second contact are configured in a co-planar arrangement; and wherein the semiconductor substrate is selected from a silicon, a gallium arsenide, gallium nitride, aluminum nitride, an aluminum oxide, or others.

* * * * *